*(12)* United States Patent
Jiang

(10) Patent No.: US 10,952,428 B2
(45) Date of Patent: Mar. 23, 2021

(54) REMOTE MONITOR FOR WILD ANIMAL TRAP

(71) Applicant: Yongxiang Jiang, Suzhou (CN)

(72) Inventor: Yongxiang Jiang, Suzhou (CN)

(73) Assignee: Donald Barton Grube, Bokchito, OK (US)

( * ) Notice: Subject to any disclaimer, the term of this patent is extended or adjusted under 35 U.S.C. 154(b) by 0 days.

(21) Appl. No.: 16/889,555

(22) Filed: Jun. 1, 2020

(65) Prior Publication Data

US 2020/0288698 A1    Sep. 17, 2020

(51) Int. Cl.
| | |
|---|---|
| *A01M 31/00* | (2006.01) |
| *A01M 23/20* | (2006.01) |
| *G08B 5/36* | (2006.01) |
| *G01R 33/07* | (2006.01) |
| *G06K 9/00* | (2006.01) |

(52) U.S. Cl.
CPC .......... *A01M 31/002* (2013.01); *A01M 23/20* (2013.01); *G01R 33/072* (2013.01); *G06K 9/00362* (2013.01); *G08B 5/36* (2013.01)

(58) Field of Classification Search
CPC ......... A01M 31/02; A01M 23/00; G08B 5/36; G01R 33/72; G06K 9/00362
See application file for complete search history.

(56) References Cited

U.S. PATENT DOCUMENTS

| | | | | |
|---|---|---|---|---|
| 2004/0020100 | A1* | 2/2004 | O'Brien | A01M 23/30 43/1 |
| 2004/0216364 | A1* | 11/2004 | Gosselin | A01M 23/08 43/61 |
| 2006/0212562 | A1* | 9/2006 | Kushwaha | H04L 41/046 709/223 |
| 2008/0204253 | A1* | 8/2008 | Cottee | A01M 23/30 340/573.2 |
| 2011/0119987 | A1* | 5/2011 | Alter | A01M 31/002 43/61 |
| 2013/0205645 | A1* | 8/2013 | Gaskamp | A01M 31/002 43/62 |
| 2013/0342344 | A1* | 12/2013 | Kramer | A01M 23/00 340/539.1 |
| 2014/0300477 | A1* | 10/2014 | Rich | A01M 23/00 340/573.2 |
| 2015/0150236 | A1* | 6/2015 | Grant | A01M 23/10 43/99 |
| 2018/0077919 | A1* | 3/2018 | McNew | A01M 31/00 |
| 2018/0249696 | A1* | 9/2018 | Daly, Jr. | A01M 23/38 |
| 2019/0037829 | A1* | 2/2019 | Laut | B01F 7/00033 |
| 2019/0220632 | A1* | 7/2019 | Sengstaken, Jr. | G06K 19/0716 |

(Continued)

*Primary Examiner* — Ojiako K Nwugo
(74) *Attorney, Agent, or Firm* — CBM Patent Consulting, LLC

(57) ABSTRACT

A remote monitor for wild animal trap, including a receiving monitoring host, a transmitting apparatus and a magnetic-sensitive switch. The host includes a VHF/VHF receiving module, LED state indicator lamps for indicating trap states and a first single chip microcomputer for processing signals, which are electrically connected. Each host can be connected with more than one transmitting apparatus through a wireless communication technology. The transmitting apparatus includes a VHF/UHF transmitting module, electric quantity indicator lamps and a second single chip microcomputer for processing signals.

6 Claims, 4 Drawing Sheets

(56) References Cited

U.S. PATENT DOCUMENTS

| | | | |
|---|---|---|---|
| 2019/0246621 A1* | 8/2019 | Kletzli | A01M 23/38 |
| 2019/0364876 A1* | 12/2019 | Kletzli | A01M 23/08 |
| 2020/0253186 A1* | 8/2020 | Files | A01M 19/00 |

* cited by examiner

REMOTE MONITOR FOR WILD ANIMAL TRAP

This application claims priority to Chinese Patent Application Ser. No. CN201921462789.7 filed on 4 Sep. 2019.

FIELD OF THE INVENTION

The invention relates to a remote monitor for wild animal trap.

BACKGROUND OF THE INVENTION

At present, an animal trap is usually placed in the wild to protect an animal through its mechanism, and meanwhile, the animal can adapt to wild environment and climate, which facilitates later-period release. However, due to the lack of a monitoring mechanism in the current animal trap, it is easy for the animal to escape, which is dangerous to the health of a breeder; besides, the survival rate of the animal will be reduced because of the failure of the animal to adapt to the wild.

SUMMARY OF THE INVENTION

The technical problem to be solved by the invention is to provide a wild animal trap remote monitor so as to solve the problems proposed in above-mentioned Background of the Invention.

The wild animal trap remote monitor is implemented by the following technical solutions: the wild animal trap remote monitor includes a host, a transmitting apparatus and a magnetic-sensitive switch. The host includes a VHF/VHF receiving module, LED state indicator lamps for monitoring trap states, and a first single chip microcomputer for processing signals. The VHF/VHF receiving module and the LED state indicator lamps are electrically connected to the first single chip microcomputer. Each host is paired with more than one transmitting apparatus. The host is connected with the transmitting apparatus through a wireless communication technology. The transmitting apparatus includes a VHF/UHF transmitting module, electric quantity indicator lamps and a second single chip microcomputer for processing the signals. The VHF/UHF transmitting module and the electric quantity indicator lamps are electrically connected to the second single chip microcomputer for processing the signals. The magnetic-sensitive switch is electrically connected to the transmitting apparatus.

As a preferred technical solution, the magnetic-sensitive switch includes a magnet and a Hall sensor. The magnet is mounted on a movable door. The Hall sensor is mounted on a door frame. The opening or closing of the movable door is detected by the Hall sensor.

As a preferred technical solution, the LED state indicator lamps comprise four first blue indicator lamps and four red indicator lamps. A first key configured to pair a password with the transmitting apparatus is mounted on the host.

As a preferred technical solution, the electric quantity indicator lamps comprise a green indicator lamp for indicating a transmitting signal and four second blue indicator lamps for respectively indicating the electric quantity of a battery. A second key for detecting the electric quantity of the battery and pairing the password is further mounted on the transmitting apparatus.

As a preferred solution, the host is powered by an AC to DC adapter.

As a preferred solution, the transmitting apparatus is powered by a rechargeable and replaceable lithium battery with the specification of 18650.

The wild animal trap remote monitor has the beneficial effects that:

1. through wireless communication, the wild animal trap remote monitor may monitor the state of an animal trap within the radius of about 1000 meters without wires;

2. the animal door detection switch uses a magnetic-sensitive switch and may be mounted on animal traps in various shapes without too precise mechanical matching degree; and meanwhile, a shell may be completely sealed using the magnetic-sensitive switch, which facilitates the use in a wild waterproof aspect;

3. a transmitting portion is powered by a rechargeable battery of 18650 and may work outdoors for 2 to 3 months by fully charging the battery once;

4. a receiving portion may simultaneously monitor a plurality of animal traps and indicate the state of each animal trap by using the indicator lamps; and 5. the host of the receiving portion and the transmitting portion respectively and internally number by pairing codes, and may not interfere with other monitors.

BRIEF DESCRIPTION OF THE DRAWINGS

In order to explain the technical solutions in the embodiments of the invention or the prior art more clearly, the accompanying drawings required for describing the embodiments or the prior art will be briefly introduced. It is apparent that the accompanying drawings in the following description are only a portion of embodiments in the invention, other accompanying drawings may be obtained according to the accompanying drawings by those of ordinary skill in the art without involving any inventive effort.

DETAILED DESCRIPTION OF THE EMBODIMENTS

Figure 1:
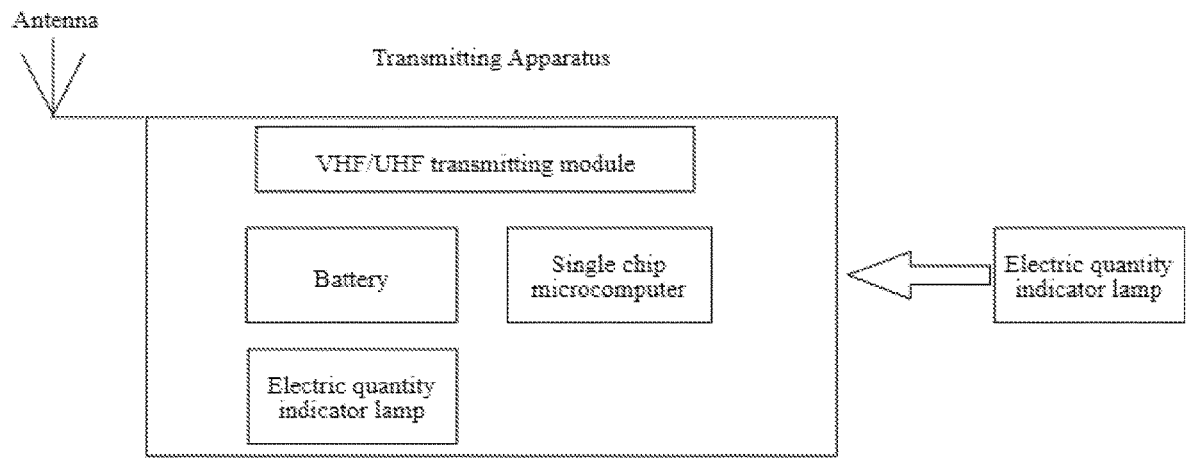
FIG. 1 is a system block diagram of a transmitting apparatus in the invention.

An embodiment of the invention is described in detail below. An example of the embodiment is illustrated in the accompanying drawings, in which the same or similar reference numerals refer to the same or similar elements or elements having the same or similar functions throughout. The embodiment described below with reference to the accompanying drawings is exemplary only, is only used for interpreting the invention but not to be interpreted as limitation to the invention.

In the description of the invention, it should be understood that the orientations or positional relationships indicated by the terms "center", "upper", "lower", "front", "rear", "left ", "right", "vertical", "horizontal", "top", "bottom", "inner", "outer", etc. are based on the orientations or positional relationships shown in the accompanying drawings, only for facilitating description of the invention and simplifying the description, rather than indicating or implying that the apparatuses or elements must have specific orientations or must be constructed and operated in specific orientations, and thus may not be interpreted as limitation to the invention.

In the description of the invention, it should be noted that the terms "mounted", "connected" and "arranged" are to be interpreted broadly, and may be, for example, fixedly connected and arranged, or detachably connected and arranged, or integrally connected and arranged, unless otherwise expressly specified and limited. For those skilled in the art, the specific meanings of the above terms in the invention may be understood in specific situations.

Figure 2:
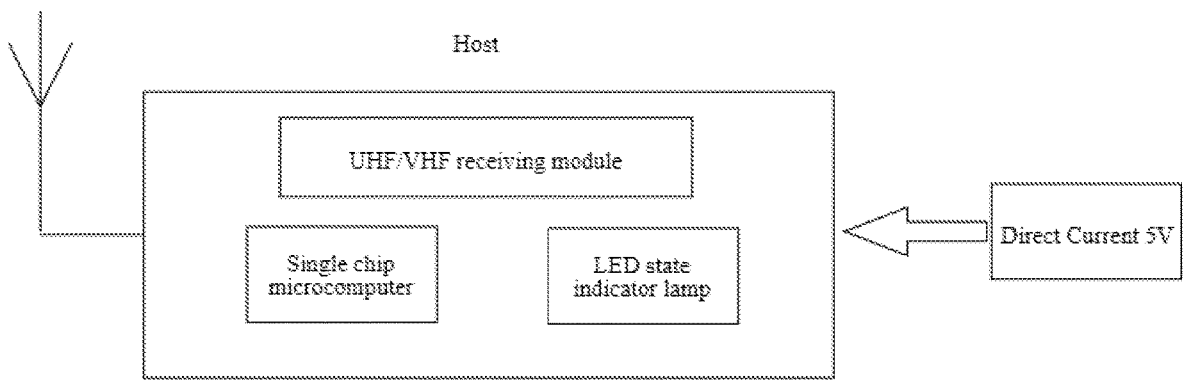
FIG. 2 is a system block diagram of a host in the invention.
Figure 3:
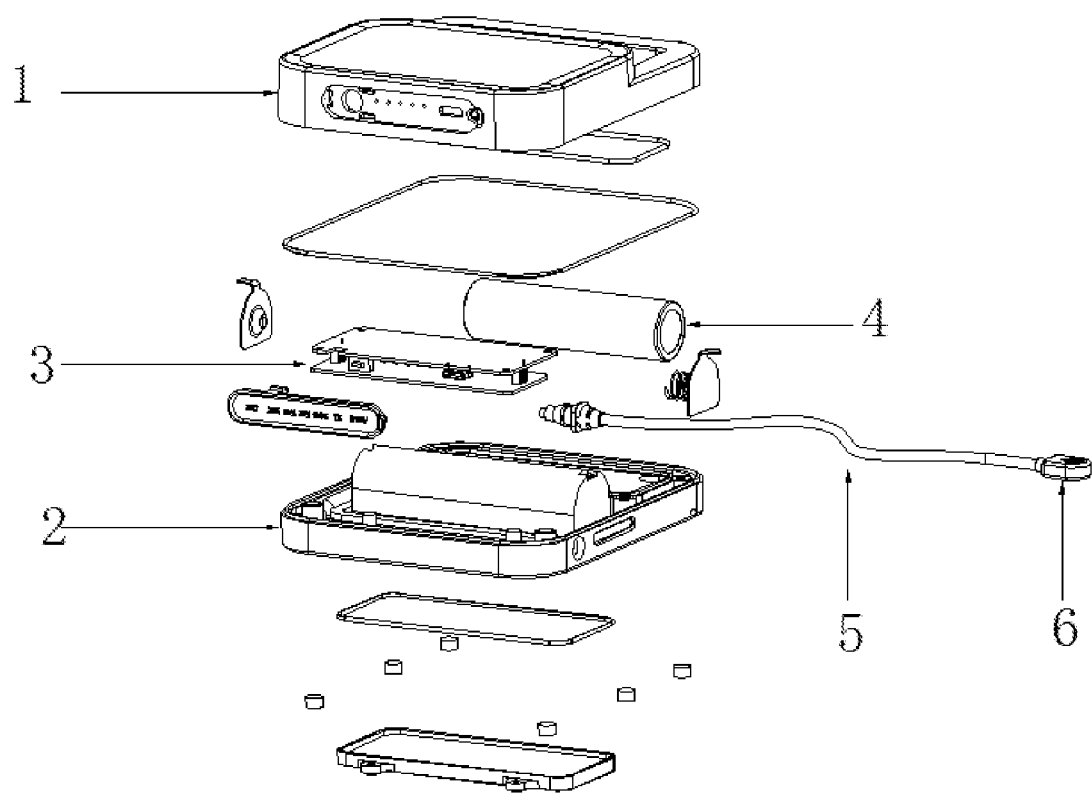
FIG. 3 is an exploded view of the transmitting apparatus in the invention.
Figure 4:
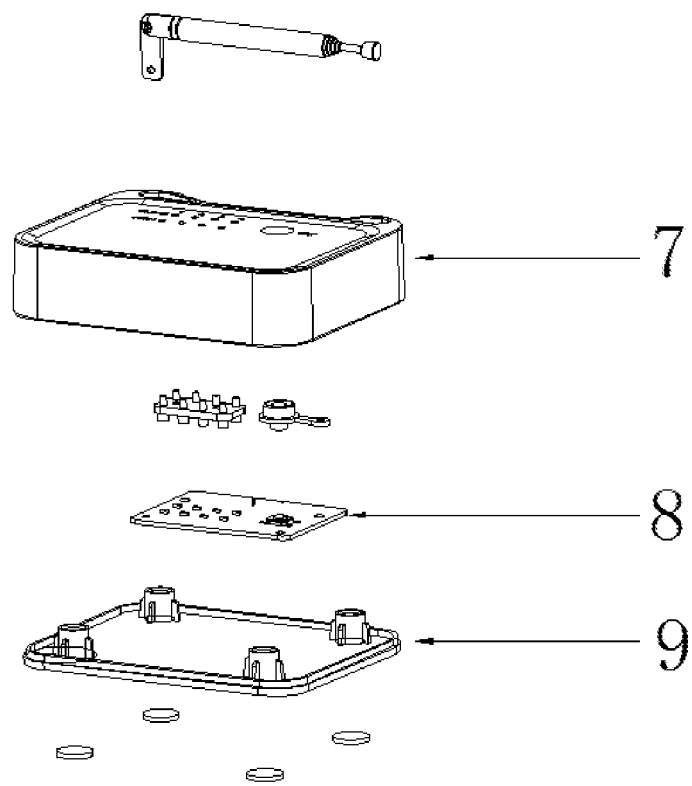
FIG. 4 is an exploded view of the host in the invention.
Figure 5:
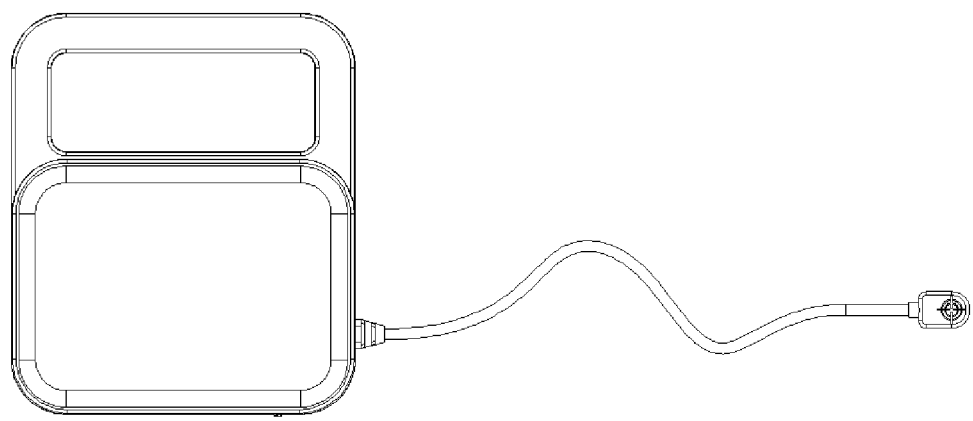
FIG. 5 is an overall structure schematic diagram of the transmitting apparatus in the invention.
Figure 6:
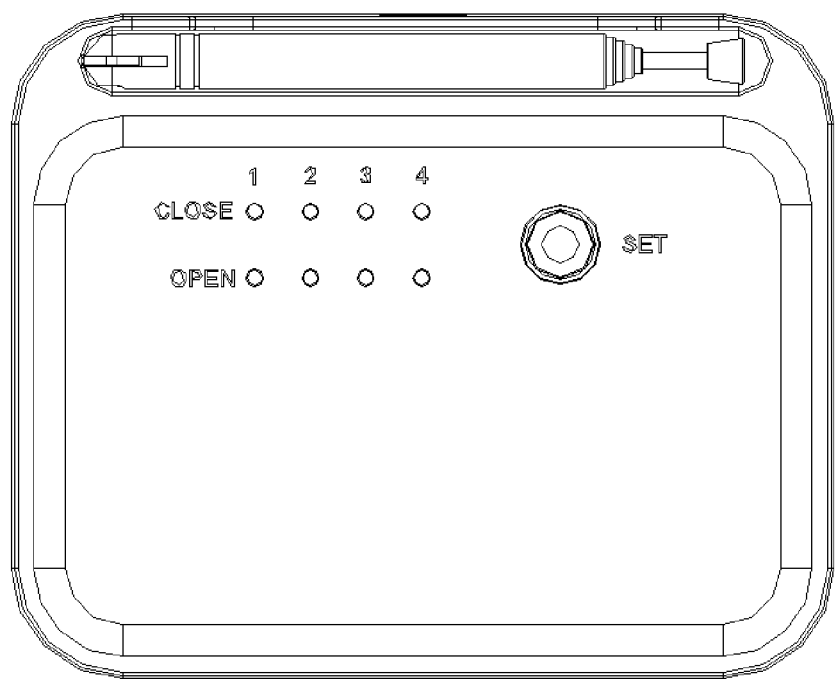
FIG. 6 is an overall structure schematic diagram of the host in the invention.

As shown in FIG. 1, FIG. 2, FIG. 3, FIG. 4, FIG. 5 and FIG. 6, the wild animal trap remote monitor of the invention includes a host, a transmitting apparatus and a magnetic-sensitive switch. The host includes a VHF/VHF receiving module, LED state indicator lamps for monitoring trap states and a first single chip microcomputer for processing signals. The VHF/VHF receiving module and the LED state indicator lamps are electrically connected to the first single chip microcomputer. Each host is paired with more than one transmitting apparatus. The host is connected with the transmitting apparatus through a wireless communication technology. The transmitting apparatus includes a VHF/UHF transmitting module, electric quantity indicator lamps and a second single chip microcomputer for processing the signals. The VHF/UHF transmitting module and the electric quantity indicator lamps are electrically connected to the second single chip microcomputer for processing the signals. The magnetic-sensitive switch is electrically connected to the transmitting apparatus.

In the embodiment, the magnetic-sensitive switch includes a magnet and a Hall sensor. The magnet is mounted on the movable door. The Hall sensor is mounted on a door frame. The opening or closing of the movable door is detected by the Hall sensor. By detecting the proximity of the magnet of the door, the Hall sensor is closed to awaken a transmitter to send a signal.

In the embodiment, the LED state indicator lamps include four first blue indicator lamps and four red indicator lamps. A first key configured to pair a password with the transmitting apparatus is mounted on the host. The states of four traps may be monitored simultaneously. When a trap is opened, a blue lamp is turned on; and when the trap is closed, the red clamp is turned on. Meanwhile, the host is provided with a key which is configured to pair the password with the transmitter (a code pairing function is used for not interfering with the same type of devices used by other families). Each host may be paired with four transmitters at most.

In the embodiment, the electric quantity indicator lamps include a green indicator lamp for indicating a transmitting signal and four second blue indicator lamps for respectively indicating the electric quantity of the battery. The four second blue indicator lamps indicate the electric quantity (25%, 50%, 75% and 100%) of the battery. A second key for detecting the electric quantity of the battery and pairing the password is further mounted on the transmitting apparatus. A Micro charging interface is mounted on the transmitting apparatus, and may be configured to charge an adapter for powering the host.

In the embodiment, the host is powered through an AC to DC adapter.

In the embodiment, the transmitting apparatus is powered by a rechargeable and replaceable lithium battery with the specification of 18650.

The transmitting apparatus includes an upper shell 1, a lower shell 2 and a first main board 3. The upper shell 1 and the lower shell 2 are spliced and fixed together. The first main board 3 is mounted inside the upper shell 1 and the lower shell 2. A lithium battery 4 for supplying power to the first main board 3 is mounted inside the lower shell 2. A wire 5 is arranged on the right side of the transmitting apparatus. One end of the wire 5 is mounted on the first main board 3, and the other end of the wire 5 is provided with a sensing head 6.

The host includes a shell 7, a lower cover 9 and a second main board 8. The lower end of the shell 7 is provided with an opening. The lower cover 9 is mounted in the opening at the lower end of the shell 7 and seals the opening. The second main board 8 is mounted inside the shell 7.

The monitor is configured to monitor the state of an animal trap door located within the range of 500 to 1000 meters around the host through wireless communication. The monitor detects the opening or closing state of the animal trap door through a mounted Hall sensor, and if the trap door is closed, a signal is sent out by means of the transmitting apparatus through the radio in a modulation mode of ASK at 433.92 MHz. The host remotely placed in a house may receive the signal indicating that the trap door is closed, and the opening or closing state of each trap door in the wild is indicated through the indicator lamps.

Technical parameters:
Transmitting portion:
1. Operating frequency: 433.92 MHz.
2. Modulation: ASK.
3. TX power: +33 dBm.
4. Standby current: 50 uA. (3.7 V)
5. Operating temperature: −20 to −60° C.
6. The standby operating time, based on the battery capacity of 2600 mAh, is greater than 6 months.

Host receiving portion:
1. Operating frequency: 433.92 MHz.
2. Modulation: ASK.
3. Sensitivity: −115 dBm.
4. Operating current: 10 mA (5 VIN).
5. Operating temperature: −20 to −60° C.

The aforementioned is only a specific embodiment of the invention, but the scope of protection of the invention is not limited thereto, and any changes or substitutions which do not involve any inventive effort should be covered within the scope of protection of the invention. Therefore, the scope of protection of the invention should be determined by the scope of protection defined in the claims.

What is claimed is:

1. A remote monitor system for wild animal trap, comprising: a host, a transmitting apparatus and a magnetic-sensitive switch; the host comprises a VHF/UHF receiving module, LED state indicator lamps for monitoring trap states, and a first single chip microcomputer for processing signals; the VHF/UHF receiving module and the LED state indicator lamps are electrically connected to the first single chip microcomputer; the host may be paired with more than one transmitting apparatus; the host is wirelessly and remotely connected to the transmitting apparatus secured to the wild animal trap, through a wireless communication technology; the transmitting apparatus comprises a VHF/UHF transmitting module, electric quantity indicator lamps and a second single chip microcomputer for processing the signals; the VHF/UHF transmitting module and the electric quantity indicator lamps are electrically connected to the second single chip microcomputer for processing the signals; and the magnetic-sensitive switch is electrically connected to the transmitting apparatus.

2. The remote monitor for wild animal trap according to claim 1, characterized in that the magnetic-sensitive switch comprises a magnet and a Hall sensor; the magnet is mounted on a movable door; the Hall sensor is mounted on a door frame; and the opening or closing of the movable door is detected by the Hall sensor.

3. The remote monitor for wild animal trap according to claim 1, characterized in that the LED state indicator lamps comprise four first blue indicator lamps and four red indicator lamps; and a first key configured to pair a password with the transmitting apparatus is mounted on the host.

4. The remote monitor for wild animal trap according to claim 1, characterized in that the electric quantity indicator lamps comprise a green indicator lamp for indicating a transmitting signal and four second blue indicator lamps for respectively indicating the electric quantity of a battery; and a second key for detecting the electric quantity of the battery and pairing the password is further mounted on the transmitting apparatus.

5. The remote monitor for wild animal trap according to claim 1, characterized in that the host is powered by an AC110V-AC220V to DC/5V adapter.

6. The remote monitor for wild animal trap according to claim 1, characterized in that the transmitting apparatus is powered by a rechargeable and replaceable lithium battery with the specification of 18650.

\* \* \* \* \*